United States Patent
Kim et al.

(10) Patent No.: US 10,644,086 B2
(45) Date of Patent: May 5, 2020

(54) ELECTROLUMINESCENT DISPLAY DEVICE

(71) Applicant: LG Display Co., Ltd., Seoul (KR)

(72) Inventors: Myung-Sung Kim, Paju-si (KR); Hyun-Il Ko, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/219,412

(22) Filed: Dec. 13, 2018

(65) Prior Publication Data

US 2019/0189712 A1 Jun. 20, 2019

(30) Foreign Application Priority Data

Dec. 14, 2017 (KR) .................. 10-2017-0172305

(51) Int. Cl.
- *H01L 51/00* (2006.01)
- *H01L 27/32* (2006.01)
- *H01L 51/50* (2006.01)
- *H01L 51/52* (2006.01)

(52) U.S. Cl.
CPC ...... *H01L 27/3246* (2013.01); *H01L 27/3258* (2013.01); *H01L 51/0003* (2013.01); *H01L 51/5012* (2013.01); *H01L 51/5218* (2013.01); *H01L 51/5221* (2013.01); *H01L 27/3262* (2013.01); *H01L 27/3276* (2013.01)

(58) Field of Classification Search
CPC ............. H01L 27/3246; H01L 27/3262; H01L 27/3258
See application file for complete search history.

(56) References Cited

U.S. PATENT DOCUMENTS

| | | | | |
|---|---|---|---|---|
| 8,587,751 | B2* | 11/2013 | Kim | G02F 1/133516 349/106 |
| 9,093,660 | B2* | 7/2015 | Yang | H01L 51/5281 |
| 9,818,973 | B2* | 11/2017 | Lee | G02B 27/26 |
| 2004/0135953 | A1* | 7/2004 | Lee | G02F 1/1339 349/141 |
| 2004/0233359 | A1* | 11/2004 | Nam | G02F 1/133371 349/114 |
| 2010/0072482 | A1* | 3/2010 | Eom | H01L 27/3276 257/72 |
| 2015/0008400 | A1* | 1/2015 | Kim | H01L 27/3279 257/40 |
| 2015/0014637 | A1* | 1/2015 | Lim | H01L 27/124 257/40 |
| 2015/0115234 | A1* | 4/2015 | Hong | H01L 51/525 257/40 |
| 2015/0144977 | A1* | 5/2015 | Odaka | H01L 33/44 257/98 |
| 2015/0147831 | A1* | 5/2015 | Lee | H01L 27/3276 438/23 |
| 2016/0172425 | A1* | 6/2016 | Lee | H01L 51/5228 257/40 |

(Continued)

Primary Examiner — Nicholas J Tobergte

(74) Attorney, Agent, or Firm — Fenwick & West LLP

(57) ABSTRACT

An electroluminescent display device includes a plurality of pixels that each comprise a portion of a substrate. A pixel dam is disposed over an intermediate layer over the substrate. An overcoat layer is in contact with the pixel dam, the overcoat layer having a planar top surface. An emitting diode is on the overcoat layer and includes a first electrode, a second electrode, and an emitting layer between the first electrode and the second electrode.

20 Claims, 5 Drawing Sheets

(56) References Cited

U.S. PATENT DOCUMENTS

| | | | |
|---|---|---|---|
| 2016/0190180 A1* | 6/2016 | Ma | H01L 27/124 |
| | | | 257/40 |
| 2016/0190505 A1* | 6/2016 | Koo | H01L 51/5228 |
| | | | 257/40 |
| 2017/0054102 A1* | 2/2017 | Hong | H01L 51/529 |
| 2017/0358769 A1* | 12/2017 | Kim | H01L 51/524 |
| 2018/0018053 A1* | 1/2018 | No | G06F 3/03545 |
| 2018/0188606 A1* | 7/2018 | Lee | H01L 27/124 |

* cited by examiner

ELECTROLUMINESCENT DISPLAY DEVICE

CROSS-REFERENCE TO RELATED APPLICATIONS

The present application claims the benefit of Republic of Korea Patent Application No. 10-2017-0172305 filed in the Republic of Korea on Dec. 14, 2017, which is hereby incorporated by reference in its entirety.

BACKGROUND

Field of Technology

The present disclosure relates to a display device, and more particularly, to an electroluminescent display device being capable of improving a uniformity of an emitting layer.

Discussion of the Related Art

An electroluminescent (EL) display device among new flat panel display devices is a self-emission type such that there are advantages in a viewing angle, a contrast ratio in comparison to a liquid crystal display device. In addition, since a backlight unit is not required in the EL display device, there are advantages of a thin profile and low power consumption.

Moreover, the EL display device can be driven by DC low voltage and has fast response time. Furthermore, the EL display device is stable against outer impacts and has advantages in an operation temperature and production cost.

In an active matrix type EL display device, a voltage, which control a current applied to a pixel, is charged in a storage capacitor such that a voltage is maintained during one frame. As a result, the EL display device has an emission state in a frame regardless of a number of gate lines.

FIG. 1 is a schematic cross-sectional view of the related art EL display device.

As shown in FIG. 1, the related art EL display device 1 includes a substrate 10, a driving thin film transistor (TFT) Td on the substrate 10 and an emitting diode D connected to the driving TFT Td.

The substrate 10 may be a glass substrate or a plastic substrate.

Although not shown, the driving TFT Td includes a semiconductor layer, a gate electrode, a source electrode and a drain electrode.

An insulating layer 51, which includes a drain contact hole 52 exposing the drain electrode of the driving TFT Td, is formed to cover the driving TFT Td.

The emitting diode D is formed on the insulating layer 51 and includes a first electrode 60, which is connected to the drain electrode of the driving TFT Td through the drain contact hole 52, an emitting layer 62 on the first electrode 60 and a second electrode 64 ono the emitting layer 62.

For example, the first electrode 60 may be an anode, and the second electrode 62 may be a cathode.

A bank 70 covering an edge of the first electrode 60 is formed on the insulating layer 51. The bank 70 includes an opening, which exposes a center of the first electrode 60, and the emitting layer 62 is formed in the opening of the bank 70.

On the other hand, the emitting layer is formed by a thermal deposition process. However, there is a limitation in the application of the thermal deposition process for the large size EL display device.

Recently, a solution process for the emitting layer is introduced. However, when the emitting layer is formed by the solution process, the emission efficiency and the lifespan of the EL display device 1 is significantly decreased.

SUMMARY

The present disclosure is directed to an electroluminescent display device that substantially obviates one or more of the problems due to limitations and disadvantages of the related art.

To achieve these and other advantages and in accordance with the purpose of the present disclosure, as embodied and broadly described herein, an electroluminescent display device includes pixels that each include a portion of a substrate, an intermediate layer over the substrate, the intermediate layer having an uneven top surface, a pixel dam over the intermediate layer and surrounding one or more of the plurality of pixels, an overcoat layer in contact with the pixel dam, the overcoat layer having a planar top surface, and an emitting diode on the overcoat layer in contact with the pixel dam, the overcoat layer having a planar top surface, and an emitting diode on the overcoat layer and including a first electrode and a second electrode, and an emitting layer between the first electrode and the second electrode.

In some embodiments, an electroluminescent display device includes a plurality of pixels, each pixel comprising a portion of a substrate, an intermediate layer over the substrate, the intermediate layer having an uneven top surface, a pixel dam over the intermediate layer and surrounding one or more of the plurality of pixels, an overcoat layer in contact with the pixel dam, the overcoat layer having a planar top surface, an emitting diode on the overcoat layer and including a first electrode, a second electrode, and an emitting layer between the first electrode and the second electrode, and a bank above at least a portion of the pixel dam and confining the emitting layer of the emitting diode.

Additional features and advantages of the disclosure will be set forth in the description which follows, and in part will be apparent from the description, or may be learned by practice of the disclosure. The objectives and other advantages of the disclosure will be realized and attained by the structure particularly pointed out in the written description and claims hereof as well as the appended drawings.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure.

DETAILED DESCRIPTION

As mentioned above, when the emitting layer is formed by the solution process, the emitting layer has a thickness deviation in an effective emission area such that the emission efficiency and the lifespan of the emitting diode and the EL display device are decreased.

Figure 1:
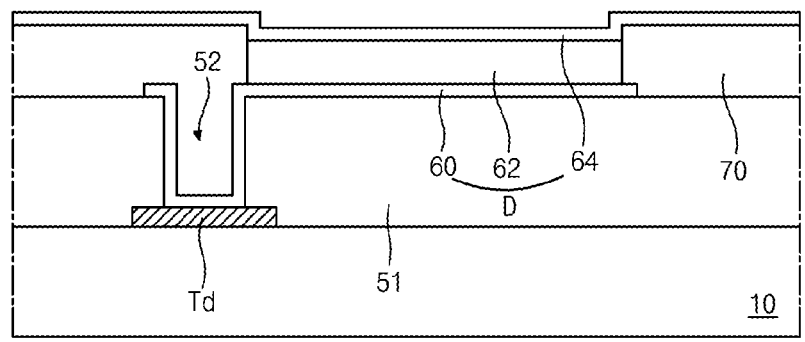
FIG. 1 is a schematic cross-sectional view of the related art EL display device.
Figure 2:
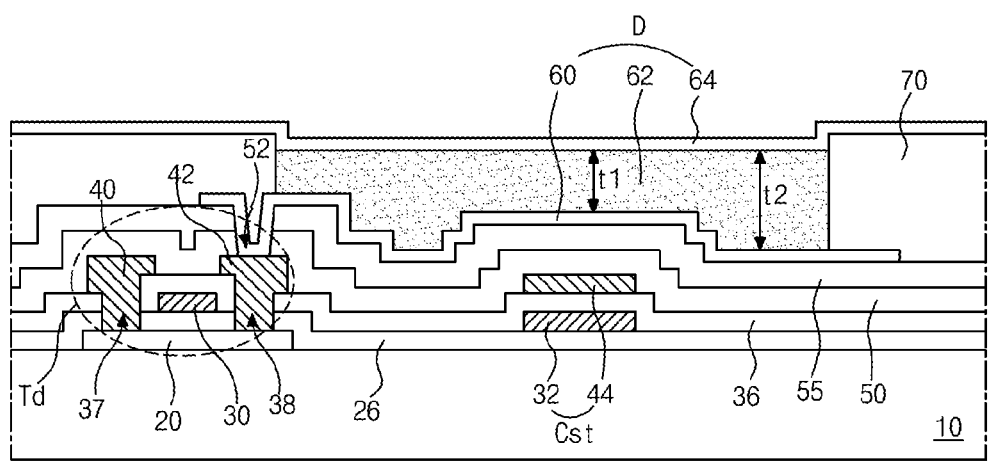
FIG. 2 is a schematic cross-sectional view illustrating a thickness deviation of an emitting layer.

Referring to FIG. 2, which is a schematic cross-sectional view illustrating a thickness deviation of an emitting layer, the EL display device 1 includes the substrate 10, the driving thin film transistor (TFT) Td on the substrate 10 and the emitting diode D connected to the driving TFT Td.

The semiconductor layer 20 is formed on the substrate 10 being formed of glass or plastic. The semiconductor layer 20 may include an oxide semiconductor material or polycrystalline silicon.

A gate insulating layer 26 is formed on the semiconductor layer 20. The gate insulating layer 26 may be formed of an inorganic insulating material such as silicon oxide or silicon nitride.

A gate electrode 30, which is formed of a conductive material, e.g., metal, is formed on the gate insulating layer 26 to correspond to a center of the semiconductor layer 20. In addition, a first capacitor electrode 32 is formed on the gate insulating layer 26.

An interlayer insulating layer 36, which is formed of an insulating material, is formed over an entire surface of the substrate 10 to cover the gate electrode 30 and the first capacitor electrode 32. The interlayer insulating layer 36 may be formed of an inorganic insulating material, e.g., silicon oxide or silicon nitride.

The interlayer insulating layer 36 includes first and second contact holes 37 and 38 exposing both sides of the semiconductor layer 20. The first and second contact holes 37 and 38 are positioned at both sides of the gate electrode 30 to be spaced apart from the gate electrode 30.

A source electrode 40 and a drain electrode 42, which are formed of a conductive material, e.g., metal, are formed on the interlayer insulating layer 36. In addition, a second capacitor electrode 44, which overlaps the first capacitor electrode 32, is formed on the interlayer insulating layer 36.

The semiconductor layer 20, the gate electrode 30, the source electrode 40 and the drain electrode 42 constitute the driving TFT Td. The first and second capacitor electrodes 32 and 44 and the interlayer insulating layer 36 therebetween constitute a storage capacitor Cst.

Although not shown, a gate line extending along a first direction, a data line extending a second direction, a switching TFT and a power line are formed on or over the substrate 10. The switching TFT is connected to the gate line and the data line, and the power line is parallel to one of the gate line and the data line.

The gate line and the data line cross to each other to define a pixel region, and the driving TFT Td is connected to the switching TFT.

A passivation layer 50 and an overcoat layer 55, which includes a drain contact hole 52 exposing the drain electrode 42 of the driving TFT Td, is formed to cover the driving TFT Td and the storage capacitor Cst.

The passivation layer 50 may be formed of an inorganic insulating material, e.g., silicon oxide or silicon nitride, and the overcoat layer 55 may be formed of an organic insulating material, e.g., benzocyclobutene or photo-acryl.

The first electrode 60, which is connected to the drain electrode 42 of the driving TFT Td through the drain contact hole 52, is formed on the overcoat layer 55. In addition, the bank 70 covering the edge of the first electrode 60 is formed on the overcoat layer 55. The bank 70 has an opening to expose a center of the first electrode 60.

The emitting layer 62 and the second electrode 64 are sequentially stacked on the first electrode 60.

The first and second electrodes 60 and 64 and the emitting layer 62 therebetween constitute the emitting diode D.

A surface of the overcoat layer 55 is uneven such that a step difference is provided. Accordingly, the first electrode 60 on the overcoat layer 55 also has a step difference. For example, the step difference results from the first and second capacitor electrodes 32 and 44.

The emitting layer 62, which is formed by the solution process, has an flat top surface in the effective emission area and a thickness deviation (thickness difference) by the step difference. Namely, the emitting layer 62 has a first thickness t1 in a higher portion of the overcoat layer 55, e.g., in a region of the storage capacitor Cst, and a second thickness t2 in a lower portion of the overcoat layer 55.

A partial thermal degradation of the emitting layer 62 is generated by the thickness deviation of the emitting layer 62 such that the emission efficiency and the lifespan of the emitting diode D and the EL display device 1 are decreased.

Reference will now be made in detail to the preferred embodiments, examples of which are illustrated in the accompanying drawings.

Figure 3:
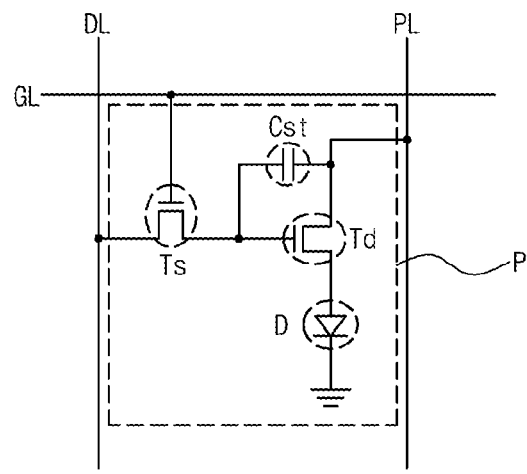
FIG. 3 is a schematic circuit diagram of an EL display device according to the present disclosure.

FIG. 3 is a schematic circuit diagram of an EL display device according to the present disclosure.

As shown in FIG. 3, an EL display device includes a gate line GL, a data line DL, a power line PL, a switching thin film transistor (TFT) Ts, a driving TFT Td, a storage capacitor Cst, and an emitting diode D. The gate line GL and the data line DL cross each other to define a pixel region P.

The switching TFT Ts is connected to the gate and data line GL and DL, and the driving TFT Td and the storage capacitor Cst are connected to the switching TFT Ts and the power line PL. The emitting diode D is connected to the driving TFT Td.

In the EL display device, when the switching TFT Ts is turned on by a gate signal applied through the gate line GL, a data signal from the data line DL is applied to the gate electrode of the driving TFT Td and an electrode of the storage capacitor Cst.

When the driving TFT Td is turned on by the data signal, an electric current is supplied to the emitting diode D from the power line PL. As a result, the emitting diode D emits light. In this case, when the driving TFT Td is turned on, a level of an electric current applied from the power line PL to the emitting diode D is determined such that the emitting diode D can produce a gray scale.

The storage capacitor Cst serves to maintain the voltage of the gate electrode of the driving TFT Td when the switching TFT Ts is turned off. Accordingly, even if the switching TFT Ts is turned off, a level of an electric current applied from the power line PL to the emitting diode D is maintained to next frame. Accordingly, the EL display device displays an image.

Figure 4:
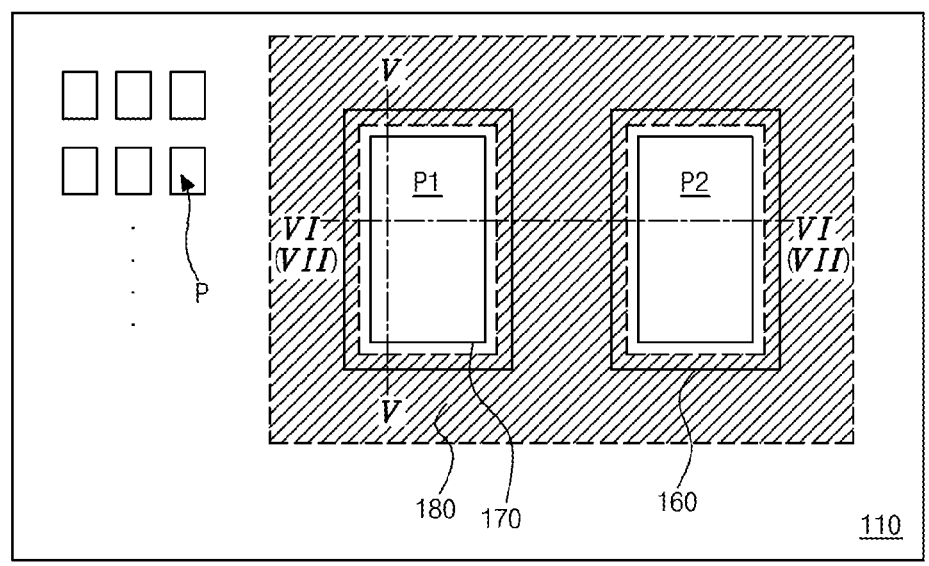
FIG. 4 is a schematic plan view of an EL display device according to a first embodiment of the present disclosure.

FIG. 4 is a schematic plan view of an EL display device according to a first embodiment of the present disclosure.

As shown in FIG. 4, the EL display device 100 includes a substrate 110, where a plurality of pixel regions P are defined, a pixel dam 180 disposed on the substrate 110 and the surrounding each pixel region P, an overcoat layer (not shown) in a region surrounded by the pixel dam 180 and provide a flat top surface, an emitting diode (not shown), which is disposed on the overcoat layer and includes a first electrode 160, an emitting layer (not shown) and a second electrode (not shown), and a bank 170 covering an edge of the first electrode 160 and corresponding to the pixel dam 180.

The overcoat layer is formed by coating an organic insulating material, such as an epoxy resin, photo-acryl, polyimide or benzocyclobutene. The overcoat layer fills a space defined by the pixel dam 180 and covers a step difference below the overcoat layer such that a flat top surface is provided.

Namely, in the related art EL display device, since an organic insulating material for the overcoat layer is coated and spread over an entire surface of the substrate, the step difference is reflected on the overcoat layer such that the overcoat layer has a height deviation (difference) from the substrate.

As a result, the first electrode on the overcoat layer also has a height deviation from the substrate by the step difference such that the emitting layer, which is formed on the first electrode by the solution process, has a thickness deviation.

However, in the EL display device 100 of the present disclosure, since the pixel dam 180, which surrounds a region on the substrate 110, serves as a buffer against the flow of the of the organic insulating material in the coating process, the organic insulation material inside the region, which is surrounded by the pixel dam 180, covers the step difference such that the overcoat layer has a uniform height from the substrate 110 and a top surface of the overcoat layer and a top surface of the pixel dam 180 are coplanar. Namely, the overcoat layer provides a flat top surface.

In other words, the pixel dam 180 confines the organic insulating material into the region, which is surrounded by the pixel dam 180, such that the step difference is not reflected on the overcoat layer. In the example shown in FIG. 4, a portion of the pixel dam 180 is disposed between adjacent pixel regions. As a result, the overcoat layer has the flat top surface.

The first electrode 160, which is formed on the overcoat layer, also has a flat top surface such that the emitting layer, which is formed on the first electrode 160, has a uniform thickness. Accordingly, the degradation of the emission efficiency and the lifespan resulting from the thickness deviation of the emitting layer is prevented.

Figure 5:
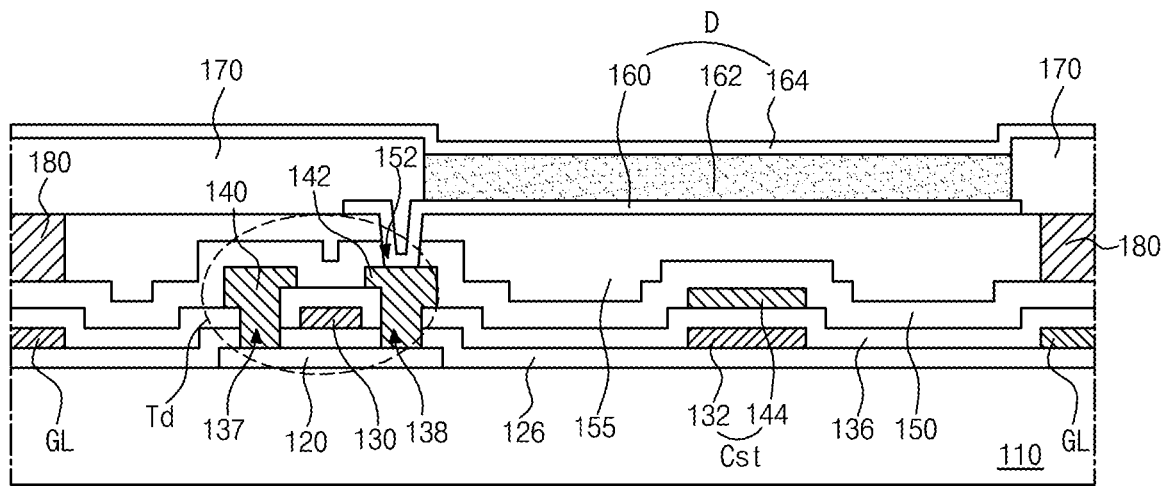
FIG. 5 is a cross-sectional view taken along the line V-V of FIG. 4 according to a first embodiment of the present disclosure.
Figure 6:
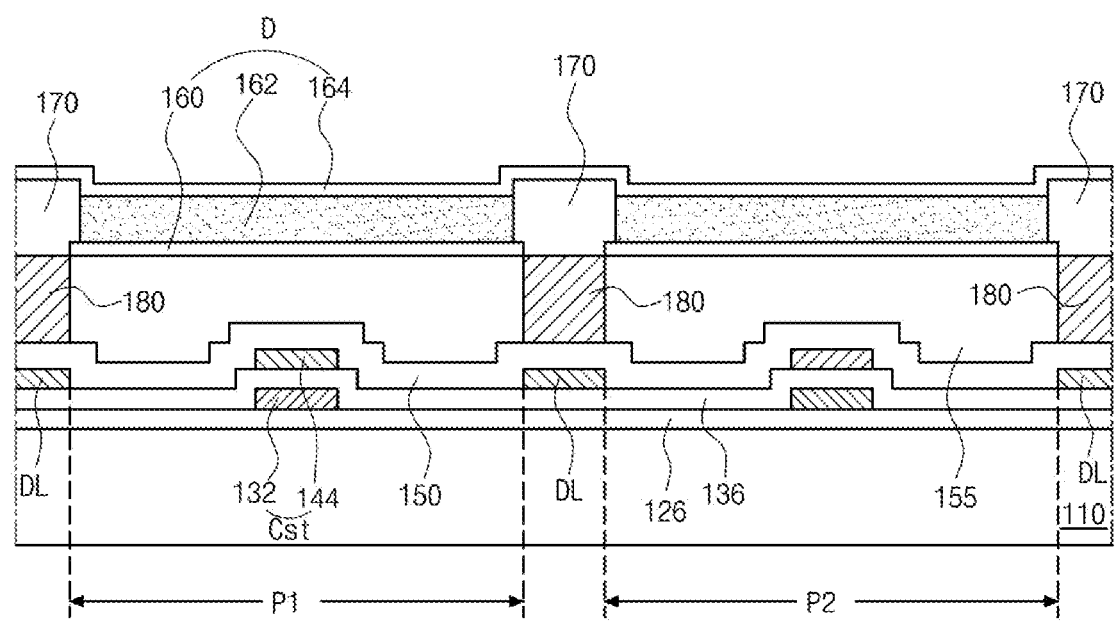
FIG. 6 is a cross-sectional view taken along the line VI-VI of FIG. 4 according to a first embodiment of the present disclosure.

FIG. 5 is a cross-sectional view taken along the line V-V of FIG. 4, and FIG. 6 is a cross-sectional view taken along the line VI-VI of FIG. 4.

Referring to FIGS. 5 and 6 with FIG. 4, the EL display device 100 includes the substrate 110, where a first pixel region P1 and a second pixel region P2 are defined, a driving TFT Td on the substrate 110, the pixel dam 180, which is disposed on or over the substrate 110 and surrounds the first and second pixel regions P1 and P2 adjacent to each other, the overcoat layer 155, which is surrounded by the pixel dam 180 and has a flat top surface, and the emitting diode D. The emitting diode D is disposed on the overcoat layer 155 and is connected to the driving TFT Td.

The substrate 110 may be a glass substrate or a flexible plastic substrate. For example, the substrate 110 may be a polyimide substrate.

A semiconductor layer 120 is formed on the substrate 110. The semiconductor layer 120 may include an oxide semiconductor material or polycrystalline silicon.

When the semiconductor layer 120 includes the oxide semiconductor material, a light-shielding pattern (not shown) may be formed under the semiconductor layer 120. The light to the semiconductor layer 120 is shielded or blocked by the light-shielding pattern such that thermal degradation of the semiconductor layer 120 can be prevented. On the other hand, when the semiconductor layer 120 includes polycrystalline silicon, impurities may be doped into both sides of the semiconductor layer 120.

Although not shown, a buffer layer may be formed between the substrate 110 and the semiconductor layer 120.

A gate insulating layer 122 is formed on the semiconductor layer 120 and over an entire surface of the substrate 110. The gate insulating layer 122 may be formed of an inorganic insulating material such as silicon oxide or silicon nitride.

A gate electrode 130, which is formed of a conductive material, e.g., metal, is formed on the gate insulating layer 122 to correspond to a center of the semiconductor layer 120. In addition, the gate line GL and a first capacitor electrode 132 are formed on the gate insulating layer 122. The gate line GL extends along the first direction, and the first capacitor electrode 132 may be connected to the gate electrode 130.

In FIG. 5, the gate insulating layer 122 is formed on an entire surface of the first substrate 110. Alternatively, the gate insulating layer 122 may be patterned to have the same shape as the gate electrode 130.

An interlayer insulating layer 136, which is formed of an insulating material, is formed on the gate electrode 130. The interlayer insulating layer 136 may be formed of an inorganic insulating material, e.g., silicon oxide or silicon nitride, or an organic insulating material, e.g., benzocyclobutene or photo-acryl.

The interlayer insulating layer 136 includes first and second contact holes 137 and 138 exposing both sides of the semiconductor layer 120. The first and second contact holes 137 and 138 are positioned at both sides of the gate electrode 130 to be spaced apart from the gate electrode 130.

In FIG. 5, the first and second contact holes 137 and 138 are formed through the gate insulating layer 122. Alternatively, when the gate insulating layer 122 is patterned to have the same shape as the gate electrode 130, the first and second contact holes 137 and 138 is formed only through the interlayer insulating layer 136.

A source electrode 140 and a drain electrode 142, which are formed of a conductive material, e.g., metal, are formed on the interlayer insulating layer 136. In addition, the data line DL along the second direction and a second capacitor electrode 144 are formed on the interlayer insulating layer 136.

The power line PL (of FIG. 3), which is spaced apart from and parallel to the data line DL, may further formed on the interlayer insulating layer 136. In FIG. 6, the data line DL is positioned between the first and second pixel regions P1 and P2. The power line PL may be disposed between the data line DL and the first pixel region P1 or between the data line DL and the second pixel region P2.

The source electrode 140 and the drain electrode 142 are spaced apart from each other with respect to the gate electrode 130 and respectively contact both sides of the semiconductor layer 120 through the first and second contact holes 137 and 138. The data line DL crosses the gate line GL to define the pixel region P. The second capacitor electrode 144 may be connected to the source electrode 140 and overlap the first capacitor electrode 132. As a result, the first and second capacitor electrodes 132 and 144 and the interlayer insulating layer 136 as a dielectric layer therebetween constitute the storage capacitor Cst.

The power line PL may be disposed at the same layer as the gate line GL and may be spaced apart from and parallel to the gate line GL.

The semiconductor layer 120, the gate electrode 130, the source electrode 140 and the drain electrode 142 constitute the driving TFT Td. In the driving TFT Td, the gate electrode 130, the source electrode 140, and the drain electrode 142 are positioned over the semiconductor layer 122. Namely, the driving TFT Td has a coplanar structure.

Alternatively, in the driving TFT Td, the gate electrode may be positioned under the semiconductor layer, and the source and drain electrodes may be positioned over the semiconductor layer such that the driving TFT Td may have an inverted staggered structure. In this instance, the semiconductor layer may include amorphous silicon.

As mentioned above, the switching TFT Ts may be further formed in the substrate 110. The switching TFT Ts may have a structure being substantially same as the driving TFT Td.

The gate electrode 130 of the driving TFT Td may be connected to a drain electrode of the switching TFT Ts, and the source electrode 140 of the driving TFT Td may be connected to the power line PL. A gate electrode and a source electrode of the switching TFT Ts may be connected to the gate line GL and the data line DL, respectively.

A passivation layer 150 is formed on the driving TFT Td. The passivation layer 150 may be formed of an inorganic insulating material such as silicon oxide or silicon nitride.

The pixel dam 180 surrounding each of the first and second pixel regions P1 and P2 is formed on the passivation layer 150. Namely, the pixel dam 180 corresponds to the gate line GL and the data line DL and has an opening in correspondence to each of the first and second pixel regions P1 and P2. As a result, the passivation layer 150 in the first and second pixel regions P1 and P2 is exposed through the opening of the pixel dam 180.

In addition, the overcoat layer 155 is formed on the passivation layer 150 in the first and second pixel regions P1 and P2. The overcoat layer 155 is surrounded by the pixel dam 180 such that the overcoat layer 155 in the first pixel region P1 and the overcoat layer 155 in the second pixel region P2 is separated or divided by the pixel dam 180.

The overcoat layer 155 is formed by a coating process (solution process). The pixel dam 180 confines a coating solution inside the pixel region P such that the overcoat layer 155 has a flat top surface.

The storage capacitor Cst is formed in each of the first and second pixel regions P1 and P2 such that a step difference is provided on the passivation layer 150. In other words, the passivation layer 150 has a height deviation from the substrate 110. In FIGS. 5 and 6, the step difference is resulted by the first and second capacitor electrodes 132 and 144 of the storage capacitor Cst. Alternatively, the step difference may be resulted by an electrode pattern or a line, which is referred to as a step difference pattern, between the substrate 110 and the overcoat layer 155.

However, in the EL display device 100 of the present disclosure, due to the pixel dam 180 surrounding the first and second pixel regions P1 and P2, the step difference of the passivation layer 150 by the storage capacitor Cst is not reflected on the overcoat layer 155 such that the overcoat layer 155 has a flat top surface without a height deviation.

The pixel dam 180 and the overcoat layer 155 have substantially the same height from the substrate 110. Accordingly, the pixel dam 180 and the overcoat layer 155 may form a flat top surface.

Each of the pixel dam 180 and the overcoat layer 155 is formed of an organic insulating material. The pixel dam 180 and the overcoat layer 155 may be formed of different materials. For example, the pixel dam 180 may be formed of one of epoxy resin, photo-acryl, polyimide and benzocyclobutene, and the overcoat layer 180 may be formed of the other one of epoxy resin, photo-acryl, polyimide and benzocyclobutene. Alternatively, the pixel dam 180 and the overcoat layer 155 may be formed of the same material.

After the pixel dam 180 is formed on the passivation layer 150, an organic insulating material is coated in the pixel region, which is surrounded by the pixel dam 180, to form the overcoat layer 155. For example, the coating process may be an inkjet coating process, a slit coating process, a spin coating process, a printing process or a drop coating process, but it is not limited thereto.

Alternatively, the pixel dam 180 may be formed in a process for forming the passivation layer 150. For example, after an inorganic insulating material layer is formed over the substrate 110, where the driving TFT Td, the data line DL and the storage capacitor Cst are formed, a mask process is performed on the inorganic insulating material layer to form the pixel dam 180 having a relatively high thickness at a boundary of the pixel region P and the passivation layer 150 having a relatively low thickness at the pixel region P. In this instance, the pixel dam 180 is formed of an inorganic insulating material, and the overcoat layer 155 is formed of an organic insulating material.

The pixel dam 180 may have a light-absorption property. For example, the pixel dam 180 may include a black particle such as carbon black. In this instance, since the ambient light (external light) is absorbed by the pixel dam 180, the decrease of the ambient contrast ratio by reflection of the ambient light on the gate line GL and/or the data line DL is prevented.

The substrate 110, where the pixel dam 180 and the overcoat layer 155 are formed, may be referred to as an array substrate.

A drain contact hole 152 exposing the drain electrode 142 of the driving TFT Td is formed through the overcoat layer 155 and the passivation layer 150. Namely, after the passivation layer 150, the pixel dam 180 and the overcoat layer 155 are formed, a mask process is performed to the overcoat layer 155 and the passivation layer 150 such that the drain contact hole 152 may be formed.

The first electrode 160, which is connected to the drain electrode 142 of the driving TFT Td through the drain contact hole 152, is formed on the overcoat layer 155. The first electrode 160 is separated in each pixel region P. The first electrode 160 may be formed of a conductive material having a relatively high work function to serve as an anode. For example, the first electrode 160 may be formed of a transparent conductive material such as indium-tin-oxide (ITO) or indium-zinc-oxide (IZO).

When the EL display device 100 is operated in a top-emission type, a reflection electrode or a reflection layer may be formed under the first electrode 160. For example, the reflection electrode or the reflection layer may be formed of silver (Ag) or aluminum-palladium-copper (APC) alloy. The first electrode 160 may have a triple-layered structure of ITO/Ag/ITO.

As mentioned above, since the overcoat layer 155 has a flat top surface without a height deviation due to the pixel dam 180, the first electrode 160 on the overcoat layer 155 also has a flat top surface without a height deviation.

The bank 170 covering an edge of the first electrode 160 is formed on the pixel dam 180. Namely, the bank 170 is positioned at a boundary of the pixel region P and overlaps at least a portion of the pixel dam 180. The bank 170 has an opening in correspondence to the pixel region P. The bank 170 surrounds the pixel region P and exposes a center of the first electrode 160. A lower surface of the bank in all sides of the pixel region P contacts the pixel dam 180.

An emitting layer 162 is formed on the first electrode 160. The emitting layer 162 may be formed by a solution process using a liquid phase emitting material.

Namely, an emitting material ink, in which an emitting material is dissolved in a solvent, is coated and dried to form the emitting layer 162. For example, the solution process may be an inkjet coating process, a slit coating process, a spin coating process, a printing process or a drop coating process, but it is not limited thereto.

The emitting material 162 includes at least one of an organic emitting material, such as a phosphorescent compound (phosphorescent emitting material) or a fluorescent compound (fluorescent emitting material), and an inorganic emitting material, such as a quantum dot.

The emitting layer 162 may have a single-layered structure of an emitting material layer (EML) including the emitting material. To improve an emitting efficiency of the emitting diode D, the emitting layer 162 may have a multi-layered structure of an hole injection layer (HIL), a hole transporting layer (HTL), the EML, an electron transporting layer (EIL) and an electron injection layer (EIL). The HIL and the HTL may be sequentially stacked between the first electrode 160 and the EML, and the ETL and the EIL may be sequentially stacked on the EML.

The top surface of the overcoat layer 155 and the top surface of the pixel dam 180 are coplanar, and the first electrode 160 is disposed on at least a portion of the overcoat layer 155. Since the overcoat layer 155 and the first electrode 160 has the flat top surface without a height deviation by the pixel dam 180, there is no thickness deviation in the emitting layer 162 formed by the solution process, the emitting layer 162 on the top surface of the first electrode 160.

The second electrode 164 is formed over the substrate 110 including the emitting layer 162. The second electrode 164 covers an entire surface of the display region. The second electrode 164 may be formed of a conductive material having a relatively low work function to serve as a cathode. For example, the second electrode 164 may be formed of aluminum (Al), magnesium (Mg), Al—Mg alloy, Al-silver alloy.

The first electrode 160, the second electrode 164 facing the first electrode 160 and the emitting layer 162 therebetween constitute the emitting diode D.

In the EL display device 100, even when a step difference is generated under the overcoat layer 155, the pixel dam 180, which surrounds a region, e.g., each pixel region P, of the substrate 110, is formed such that the overcoat layer 155 covers the step difference and has the flat top surface without a height deviation (height difference). Accordingly, the thickness uniformity of the emitting layer 162 is improved, and the emission efficiency and the lifespan of the EL display device 100 are also improved.

Figure 7:
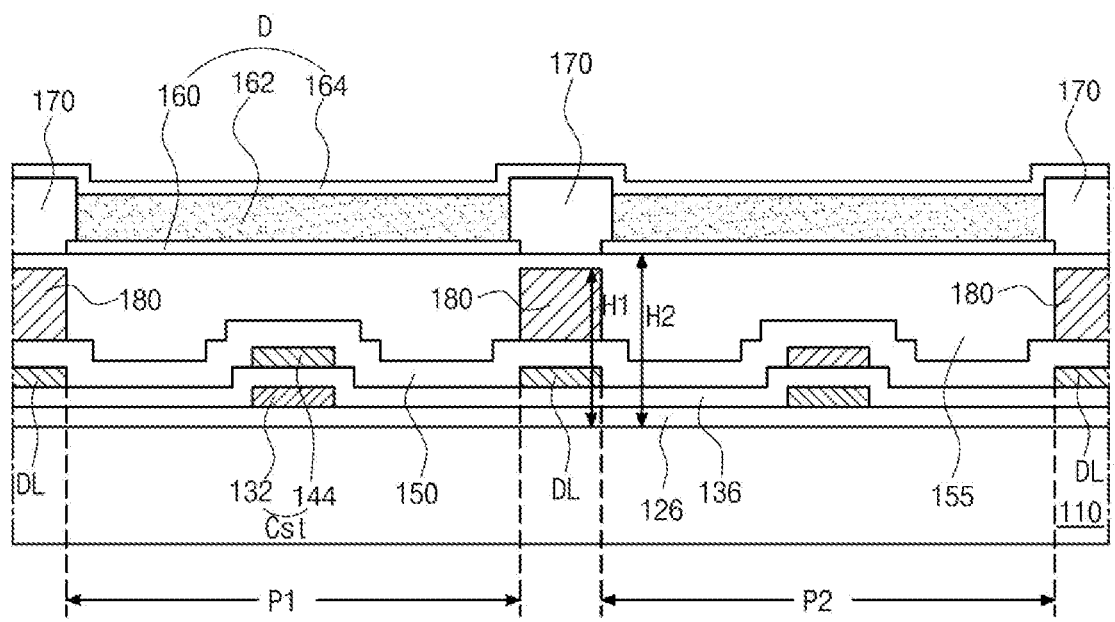
FIG. 7 is a schematic cross-sectional view of an EL display device according to a second embodiment of the present disclosure.

FIG. 7 is a schematic plan view of an EL display device according to a second embodiment of the present disclosure. FIG. 7 is a cross-sectional view taken along the line VII-VII of FIG. 4.

Referring to FIG. 7 with FIGS. 4 and 5, the EL display device 100 includes a substrate 110, where a first pixel region P1 and a second pixel region P2 are defined, a driving TFT Td on the substrate 110, a pixel dam 180, which is disposed on or over the substrate 110 and surrounds the first and second pixel regions P1 and P2 adjacent to each other, an overcoat layer 155, which is surrounded by the pixel dam 180 and has a flat top surface, and an emitting diode D. The emitting diode D is disposed on the overcoat layer 155 and is connected to the driving TFT Td.

A semiconductor layer 120 is formed on the substrate 110. The semiconductor layer 120 may include an oxide semiconductor material or polycrystalline silicon.

A gate insulating layer 122 of an insulating material is formed on the semiconductor layer 120 and over an entire surface of the substrate 110.

A gate electrode 130, which is formed of a conductive material, e.g., metal, is formed on the gate insulating layer 122 to correspond to a center of the semiconductor layer 120. In addition, the gate line GL and a first capacitor electrode 132 are formed on the gate insulating layer 122. The gate line GL extends along the first direction, and the first capacitor electrode 132 may be connected to the gate electrode 130.

An interlayer insulating layer 136, which is formed of an insulating material, is formed on the gate electrode 130. The interlayer insulating layer 136 includes first and second contact holes 137 and 138 exposing both sides of the semiconductor layer 120. The first and second contact holes 137 and 138 are positioned at both sides of the gate electrode 130 to be spaced apart from the gate electrode 130.

A source electrode 140 and a drain electrode 142, which are formed of a conductive material, e.g., metal, are formed on the interlayer insulating layer 136. In addition, the data line DL along the second direction and a second capacitor electrode 144 are formed on the interlayer insulating layer 136.

The power line PL (of FIG. 3), which is spaced apart from and parallel to the data line DL, may further formed on the interlayer insulating layer 136. In FIG. 6, the data line DL is positioned between the first and second pixel regions P1 and P2. The power line PL may be disposed between the data line DL and the first pixel region P1 or between the data line DL and the second pixel region P2.

The source electrode 140 and the drain electrode 142 are spaced apart from each other with respect to the gate electrode 130 and respectively contact both sides of the semiconductor layer 120 through the first and second contact holes 137 and 138. The data line DL crosses the gate line GL to define the pixel region P. The second capacitor electrode 144 may be connected to the source electrode 140 and overlap the first capacitor electrode 132. As a result, the first and second capacitor electrodes 132 and 144 and the interlayer insulating layer 136 as a dielectric layer therebetween constitute the storage capacitor Cst.

The power line PL may be disposed at the same layer as the gate line GL and may be spaced apart from and parallel to the gate line GL.

The semiconductor layer 120, the gate electrode 130, the source electrode 140 and the drain electrode 142 constitute the driving TFT Td.

A passivation layer 150 is formed on the driving TFT Td. The passivation layer 150 may be formed of an inorganic insulating material such as silicon oxide or silicon nitride.

The pixel dam 180 surrounding each of the first and second pixel regions P1 and P2 is formed on the passivation layer 150. Namely, the pixel dam 180 corresponds to the gate line GL and the data line DL and has an opening in correspondence to each of the first and second pixel regions P1 and P2. As a result, the passivation layer 150 in the first and second pixel regions P1 and P2 is exposed through the opening of the pixel dam 180. The pixel dam 180 has a first height H1 from the substrate 110.

In addition, the overcoat layer 155 is formed on the passivation layer 150 in the first and second pixel regions P1 and P2. The overcoat layer 155 is formed by a coating process (solution process). The pixel dam 180 confines a coating solution inside the pixel region P such that the overcoat layer 155 has a flat top surface.

The overcoat layer 155 has a second height H2, which is slightly greater than the first height H1, from the substrate 110, and covers a top surface of the pixel dam 180. In the EL display device 100 according to the first embodiment of the present disclosure, the overcoat layer 155 and the pixel dam 180 have substantially the same height such that the overcoat layers 155 in the first pixel region P1 and the second pixel region P2 are separated by the pixel dam 180 positioned between the first and second pixel regions P1 and P2. However, in the EL display device 100 according to the second embodiment of the present disclosure, the overcoat layers 155 in the first pixel region P1 and the second pixel region P2 are connected over the pixel dam 180.

The overcoat layer 155 is formed using a solution process which coats a top surface of the passivation layer 150 with a liquid phase solution of the overcoat layer 155. Once the overcoat layer 155 is deposited on the top surface of the passivation layer 150 may be left to dry before forming the emitting diode D. When the pixel dam 180 and the overcoat layer 155 have the same height from the substrate 110, the overcoat layer 155 in each pixel region P may have a height deviation in a center and an edge by the process of forming the overcoat layer 155. As the overcoat layer 155 dries, the thickness of the edge may be greater than the thickness of the center due to a coffee ring effect that causes flow of solution towards the edge (e.g., the boundary where the overcoat layer 155 contacts the pixel dam 180). In addition, when the pixel dam 180 and the overcoat layer 155 are formed of different materials, there may be a problem in an adhesion property of the first electrode 160 by a property difference at a boundary between the pixel dam 180 and the overcoat layer 155.

However, in the EL display device 100 according to the second embodiment of the present disclosure, since the overcoat layer 155 has the second height H2 being slightly greater than the first height H1 of the pixel dam 180 and covers the top surface of the pixel dam 180, the above problem is prevented.

A drain contact hole 152 exposing the drain electrode 142 of the driving TFT Td is formed through the overcoat layer 155 and the passivation layer 150.

The first electrode 160, which is connected to the drain electrode 142 of the driving TFT Td through the drain contact hole 152, is formed on the overcoat layer 155. The first electrode 160 is separated in each pixel region P. The first electrode 160 may be formed of a conductive material having a relatively high work function to serve as an anode.

As mentioned above, since the overcoat layer 155 has a flat top surface without a height deviation due to the pixel dam 180, the first electrode 160 on the overcoat layer 155 also has a flat top surface without a height deviation.

The bank 170 covering an edge of the first electrode 160 is formed on the overcoat layer 155. Namely, the bank 170 is positioned at a boundary of the pixel region P and overlaps the pixel dam 180. The bank 170 has an opening in correspondence to the pixel region P. The bank 170 surrounds the pixel region P and exposes a center of the first electrode 160.

An emitting layer 162 is formed on the first electrode 160. The emitting layer 162 may be formed by a solution process using a liquid phase emitting material.

The emitting material 162 includes at least one of an organic emitting material, such as a phosphorescent compound (phosphorescent emitting material) or a fluorescent compound (fluorescent emitting material), and an inorganic emitting material, such as a quantum dot.

Since the overcoat layer 155 and the first electrode 160 has the flat top surface without a height deviation by the pixel dam 180, there is no thickness deviation in the emitting layer 162 formed by the solution process.

The second electrode 164 is formed over the substrate 110 including the emitting layer 162. The second electrode 164 covers an entire surface of the display region. The second electrode 164 may be formed of a conductive material having a relatively low work function to serve as a cathode.

The first electrode 160, the second electrode 164 facing the first electrode 160 and the emitting layer 162 therebetween constitute the emitting diode D.

In the EL display device 100, even when a step difference is generated under the overcoat layer 155, the pixel dam 180, which surrounds a region, e.g., each pixel region P, of the substrate 110, is formed such that the overcoat layer 155 covers the step difference and has the flat top surface without a height deviation (height difference). Accordingly, the thickness uniformity of the emitting layer 162 is improved, and the emission efficiency and the lifespan of the EL display device 100 are also improved.

Figure 8:
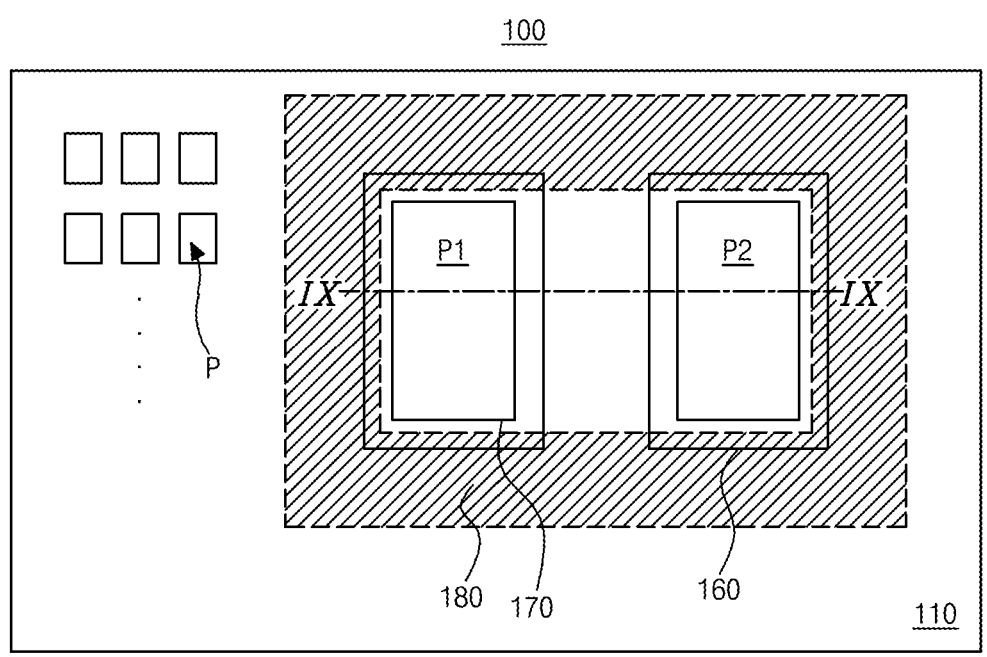
FIG. 8 is a schematic plan view of an EL display device according to a third embodiment of the present disclosure.
Figure 9:
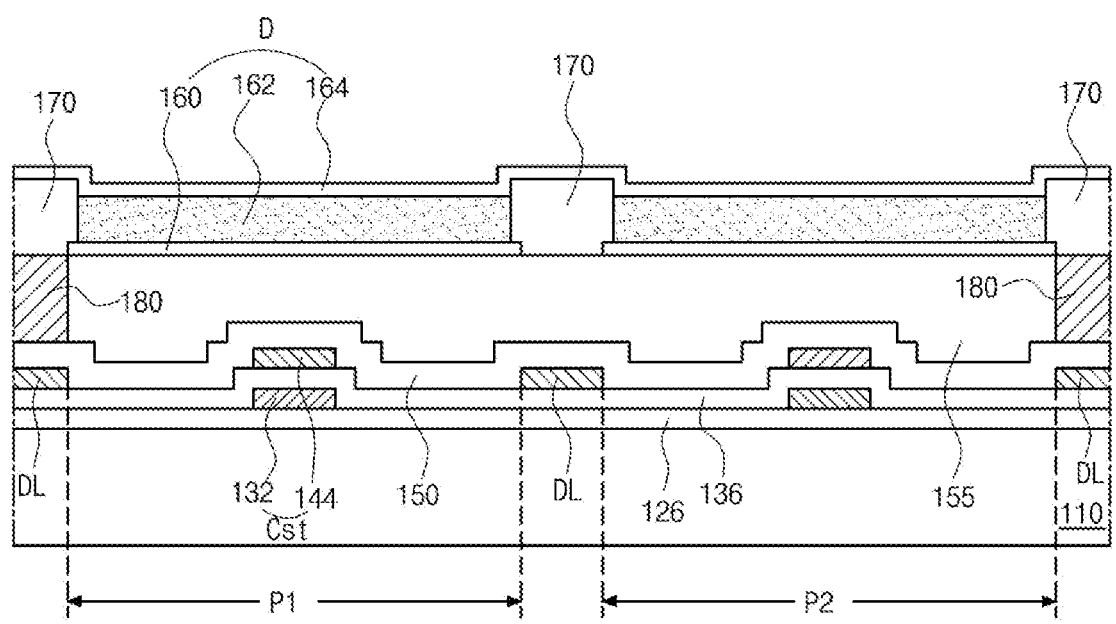
FIG. 9 is a cross-sectional view taken along the line IX-IX of FIG. 8 according to a third embodiment of the present disclosure.

FIG. 8 is a schematic plan view of an EL display device according to a third embodiment of the present disclosure, and FIG. 9 is a cross-sectional view taken along the line IX-IX of FIG. 8.

Referring to FIGS. 8 and 9 with FIG. 5, the EL display device 100 includes the substrate 110, where a first pixel region P1 and a second pixel region P2 are defined, a driving TFT Td on the substrate 110, the pixel dam 180, which is disposed on or over the substrate 190 and surrounds the first and second pixel regions P1 and P2 adjacent to each other, the overcoat layer 155, which is surrounded by the pixel dam 180 and has a flat top surface in the first and second pixel regions P1 and P2, and the emitting diode D. The emitting diode D is disposed on the overcoat layer 155 and is connected to the driving TFT Td.

A semiconductor layer 120 is formed on the substrate 110. The semiconductor layer 120 may include an oxide semiconductor material or polycrystalline silicon.

A gate insulating layer 122 of an insulating material is formed on the semiconductor layer 120 and over an entire surface of the substrate 110.

A gate electrode 130, which is formed of a conductive material, e.g., metal, is formed on the gate insulating layer 122 to correspond to a center of the semiconductor layer 120. In addition, the gate line GL and a first capacitor electrode 132 are formed on the gate insulating layer 122. The gate line GL extends along the first direction, and the first capacitor electrode 132 may be connected to the gate electrode 130.

An interlayer insulating layer 136, which is formed of an insulating material, is formed on the gate electrode 130. The interlayer insulating layer 136 includes first and second contact holes 137 and 138 exposing both sides of the semiconductor layer 120. The first and second contact holes 137 and 138 are positioned at both sides of the gate electrode 130 to be spaced apart from the gate electrode 130.

A source electrode 140 and a drain electrode 142, which are formed of a conductive material, e.g., metal, are formed on the interlayer insulating layer 136. In addition, the data line DL along the second direction and a second capacitor electrode 144 are formed on the interlayer insulating layer 136.

The power line PL (of FIG. 3), which is spaced apart from and parallel to the data line DL, may further formed on the interlayer insulating layer 136. In FIG. 9, the data line DL is positioned between the first and second pixel regions P1 and P2. The power line PL may be disposed between the data line DL and the first pixel region P1 or between the data line DL and the second pixel region P2.

The source electrode 140 and the drain electrode 142 are spaced apart from each other with respect to the gate electrode 130 and respectively contact both sides of the semiconductor layer 120 through the first and second contact holes 137 and 138. The data line DL crosses the gate line GL to define the pixel region P. The second capacitor electrode 144 may be connected to the source electrode 140 and overlap the first capacitor electrode 132. As a result, the first and second capacitor electrodes 132 and 144 and the interlayer insulating layer 136 as a dielectric layer therebetween constitute the storage capacitor Cst.

The power line PL may be disposed at the same layer as the gate line GL and may be spaced apart from and parallel to the gate line GL.

The semiconductor layer 120, the gate electrode 130, the source electrode 140 and the drain electrode 142 constitute the driving TFT Td.

A passivation layer 150 is formed on the driving TFT Td. The passivation layer 150 may be formed of an inorganic insulating material such as silicon oxide or silicon nitride.

The pixel dam 180 surrounding the first and second pixel regions P1 and P2 as a whole is formed on the passivation layer 150. Namely, the pixel dam 180 has an opening in correspondence to both of the first and second pixel regions P1 and P2.

In other words, the pixel dam 180 surrounds a pixel unit including adjacent two pixel regions P1 and P2, and there is no pixel dam 180 between the first and second pixel regions P1 and P2. In FIG. 8, adjacent two pixel regions P1 and P2 form the pixel unit. Alternatively, at least one pixel region between the first and second pixel regions P1 and P2 may be included in the pixel unit. In addition, four pixel regions, which is arranged by 2*2 matrix, form the pixel unit, and the pixel dam 180 may surround four pixel regions as a whole.

The overcoat layer 155 is formed on the passivation layer 150 in the pixel unit of the first and second pixel regions P1 and P2. The overcoat layer 155 is formed by a coating process (solution process). The pixel dam 180 confines a coating solution inside the pixel region P such that the overcoat layer 155 has a flat top surface.

A drain contact hole 152 exposing the drain electrode 142 of the driving TFT Td is formed through the overcoat layer 155 and the passivation layer 150.

The first electrode 160, which is connected to the drain electrode 142 of the driving TFT Td through the drain contact hole 152, is formed on the overcoat layer 155. The first electrode 160 is separated in each pixel region P. The first electrode 160 may be formed of a conductive material having a relatively high work function to serve as an anode.

As mentioned above, since the overcoat layer 155 has a flat top surface without a height deviation due to the pixel dam 180, the first electrode 160 on the overcoat layer 155 also has a flat top surface without a height deviation.

The bank 170 covering an edge of the first electrode 160 is formed on the overcoat layer 155. Namely, the bank 170 is positioned at a boundary of the pixel region P. The bank 170 has an opening in correspondence to the pixel region P. The bank 170 surrounds the pixel region P and exposes a center of the first electrode 160.

Namely, the opening of the bank 170 corresponds to each of the first and second pixel regions P1 and P2, and the opening of the pixel dam 180, which corresponds to the first and second pixel regions P1 and P2 as a whole, is greater than the opening of the bank 170.

In three sides of each pixel region P, a lower surface of the bank 170 contacts the pixel dam 180. In the other one side of each pixel region P, the lower surface of the bank 170 contacts the overcoat layer 155. Alternatively, when the pixel dam 180 surrounds the first pixel P1, the second pixel P2 and a third pixel, which is positioned between the first and second pixels P1 and P2, the lower surface of the bank 170 in two sides of the third pixel region contacts the pixel dam 180, and the lower surface of the bank 170 in the other two sides of the third pixel region contacts the overcoat layer 155.

Namely, in the EL display device 100 according to the third embodiment of the present disclosure, the lower surface of the bank 170 in at least two sides of the pixel region contacts the pixel dam 180, and the lower surface of the bank 170 in at least one side of the third pixel region contacts the overcoat layer 155.

An emitting layer 162 is formed on the first electrode 160. The emitting layer 162 may be formed by a solution process using a liquid phase emitting material.

The emitting material 162 includes at least one of an organic emitting material, such as a phosphorescent compound (phosphorescent emitting material) or a fluorescent compound (fluorescent emitting material), and an inorganic emitting material, such as a quantum dot.

Since the overcoat layer 155 and the first electrode 160 has the flat top surface without a height deviation by the pixel dam 180, there is no thickness deviation in the emitting layer 162 formed by the solution process.

The second electrode 164 is formed over the substrate 110 including the emitting layer 162. The second electrode 164 covers an entire surface of the display region. The second electrode 164 may be formed of a conductive material having a relatively low work function to serve as a cathode.

The first electrode 160, the second electrode 164 facing the first electrode 160 and the emitting layer 162 therebetween constitute the emitting diode D.

In the EL display device 100, even when a step difference is generated under the overcoat layer 155, the pixel dam 180, which surrounds a region, e.g., each pixel region P, of the substrate 110, is formed such that the overcoat layer 155 covers the step difference and has the flat top surface without a height deviation (height difference). Accordingly, the thickness uniformity of the emitting layer 162 is improved, and the emission efficiency and the lifespan of the EL display device 100 are also improved.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. An electroluminescent display device comprising:
   a plurality of pixels, each pixel comprising a portion of a substrate;
   an intermediate layer over the substrate, the intermediate layer having an uneven top surface;
   a pixel dam over the intermediate layer and surrounding one or more of the plurality of pixels;
   an overcoat layer in contact with the pixel dam, the overcoat layer having a planar top surface; and
   an emitting diode on the overcoat layer and including a first electrode, a second electrode, and an emitting layer between the first electrode and the second electrode,
   wherein the pixel dam has a light-absorption property.

2. The electroluminescent display device according to claim 1, wherein the intermediate layer is a passivation layer or an insulating layer.

3. The electroluminescent display device according to claim 1, wherein the pixel dam and the intermediate layer are formed of a same material and formed by a same process as each other.

4. The electroluminescent display device according to claim 1, wherein the pixel dam and the overcoat layer are formed of different materials.

5. The electroluminescent display device according to claim 1, wherein a top surface of the pixel dam and the top surface of the overcoat layer are coplanar.

6. The electroluminescent display device according to claim 1, wherein a top surface of the pixel dam is lower than the top surface of the overcoat layer.

7. The electroluminescent display device according to claim 1, wherein the overcoat layer is formed by a solution process.

8. The electroluminescent display device according to claim 1, wherein a portion of the pixel dam is disposed between adjacent pixels of the plurality of pixels.

9. The electroluminescent display device according to claim 1, further comprising:
   a bank above the pixel dam, the bank configured to confine the emitting layer of the emitting diode and cover an edge of the first electrode.

10. The electroluminescent display device according to claim 9, wherein at least a portion of a bottom surface of the bank contacts the pixel dam.

11. The electroluminescent display device according to claim 10, wherein another portion of the bottom surface of the bank contacts the top surface of the overcoat layer.

12. The electroluminescent display device according to claim 1, wherein the emitting layer is formed by a solution process.

13. The electroluminescent display device according to claim 1, further comprising:
   a thin film transistor between the substrate and the intermediate layer, the first electrode connected to the thin film transistor.

14. An electroluminescent display device comprising:
   a plurality of pixels, each pixel comprising a portion of a substrate;
   an intermediate layer over the substrate, the intermediate layer having an uneven top surface;
   a pixel dam over the intermediate layer and surrounding one or more of the plurality of pixels;
   an overcoat layer in contact with the pixel dam, the overcoat layer having a planar top surface;
   an emitting diode on the overcoat layer and including a first electrode, a second electrode, and an emitting layer between the first electrode and the second electrode; and
   a bank above at least a portion of the pixel dam and confining the emitting layer of the emitting diode,
   wherein a portion of a bottom surface of the bank contacts the pixel dam.

15. The electroluminescent display device of claim 14, wherein the intermediate layer is a passivation layer or an insulating layer.

16. The electroluminescent display device according to claim 14, wherein a top surface of the pixel dam and the top surface of the overcoat layer are coplanar.

17. The electroluminescent display device according to claim 14, wherein a top surface of the pixel dam is lower than the top surface of the overcoat layer.

18. The electroluminescent display device according to claim 14, wherein a portion of the pixel dam is disposed between adjacent pixels of the plurality of pixels.

19. The electroluminescent display device according to claim 14, wherein the bank covers an edge of the first electrode.

20. The electroluminescent display device according to claim 14, wherein another portion of the bottom surface of the bank contacts the top surface of the overcoat layer.

* * * * *